United States Patent [19]

Andrea

[11] Patent Number: 5,506,545
[45] Date of Patent: Apr. 9, 1996

[54] ELECTRONIC APPARATUS HAVING LOW RADIO FREQUENCY INTERFERENCE FROM CONTROLLED EXCURSION NOISE-MODULATED SYSTEM CLOCK SIGNAL

[75] Inventor: Ralph W. Andrea, Sunnyvale, Calif.

[73] Assignee: GTE Government Systems Corporation, Mountain View, Calif.

[21] Appl. No.: 149,427

[22] Filed: Nov. 9, 1993

[51] Int. Cl.⁶ .............................. H04L 7/00; H03B 29/00
[52] U.S. Cl. ................................................ 331/78; 331/25
[58] Field of Search .................................... 331/78, 10, 63, 331/17, 23, 25, 15, 47, 67; 455/260; 327/8, 147, 156, 244, 311, 558, 553

[56] References Cited

U.S. PATENT DOCUMENTS 3,573,652  4/1971  Charters ....................... 331/78
4,507,796  3/1985  Stumfall ....................... 375/106
5,115,202  5/1992  Brown ............................ 330/9

*Primary Examiner*—Robert J. Pascal
*Assistant Examiner*—David H. Vu
*Attorney, Agent, or Firm*—James J. Cannon, Jr.

[57]  ABSTRACT

A spread-spectrum clock circuit is applied to microprocessor or other clocked digital electronic equipment for the purpose of reducing spectral emissions residing at harmonic and subharmonic multiples of the clock frequency. This clock randomly varies the frequency of its output within a frequency constraint bound centered at the average clock frequency. The center frequency of the spread-spectrum clock is stable and is usable for timing and measurement applications. The spread-spectrum clock is a sealed, self-contained circuit module that can be applied to existing digital electronic equipment without modification.

4 Claims, 4 Drawing Sheets

5,506,545

ELECTRONIC APPARATUS HAVING LOW RADIO FREQUENCY INTERFERENCE FROM CONTROLLED EXCURSION NOISE-MODULATED SYSTEM CLOCK SIGNAL

BACKGROUND OF THE INVENTION

1. Field Of The Invention

This invention relates to the reduction in magnitude of radiated noise emanating from clocked digital circuitry and more pailing itself, whose frequency spectral components have been spread for the purpose of noise reduction.

2. Description of the Prior Art

Modern digital equipment is generally controlled by microprocessors or similar clocked control circuitry which are, in turn, tied to a master clock. It is the synchronization of the various digital events to a master clock that causes the emanation of electromagnetic radiation at frequencies which are harmonically and subharmonically related to the master clock frequency. These radiated spectral components can interfere with radio and navigation equipment. An example of this type of interference is the use of portable lap-top computers aboard commercial aircraft where sensitive radio navigation equipment can be disturbed.

In the Brown patent, U.S. Pat. No. 5,115,202, a binary pseudo-random (PN) sequence was substituted for a conventional digital clock circuit in a chopper stabilized amplifier. This resulted in the reduction of interference which was caused by the presence of a digital clock signal in the amplifier. While the direct substitution of a PN spreading sequence in place of the digital clock solved the interference problem for signals below the clock frequency, we should note that the state transitions of the PN sequence are still aligned with the master clock. Another solution is required for reduction of high frequency spectral components related to the clock frequency.

SUMMARY OF THE INVENTION

In a first aspect of the invention, a variable frequency clock generation circuit for the reduction of spectral components above the fundamental frequency is provided by utilizing a local oscillator means for providing a local oscillator signal, a frequency generation and tracking means for providing a clock output whose average frequency is matched to said local oscillator means, and a random noise generation means for providing a random modulating function for the variable frequency clock. The frequency generation and tracking means provides a voltage to frequency conversion of said random noise generation means. A signal combining means combines the output of said random noise generation means into the output of said frequency generation and tracking means. Thus, the frequency of the random noise source modulates the output of the frequency generation and tracking means, thereby providing the variable frequency output.

In a further aspect of the invention, said frequency generation means is frequency locked and phase locked to said local oscillator.

In a still further aspect of the invention, the variable frequency clock includes a filter for the purpose of reducing the rate of change of the random noise generator, and a limiter to restrict the minimum and maximum magnitude of the output of the random noise generator.

In another aspect of the invention, said variable frequency clock generation circuit includes a voltage controlled clock for said voltage to frequency conversion.

DETAILED DESCRIPTION OF THE PREFERRED EMBODIMENT

Figure 3:
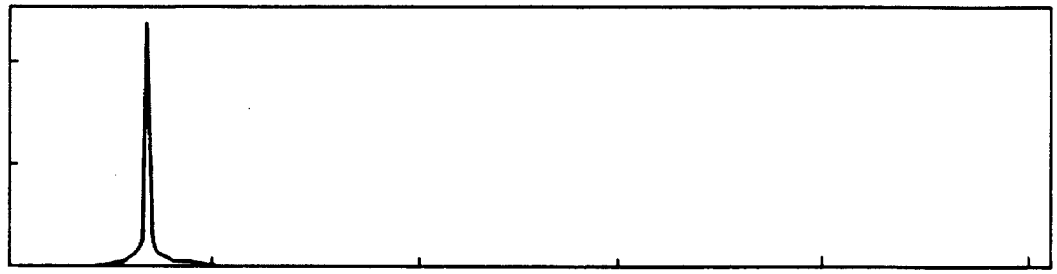
FIG. 3 is an example of a spurious emission from a prior art clocked digital circuit.

The synchronization of the various digital events-to a master clock causes the emanation of electromagnetic radiation at frequencies ,which are harmonically and subharmonically related to the master clock frequency. The power spectrum of a typical spurious emission is shown in FIG. 3. This is a discrete spectral component with a certain amount of energy. The present invention solves the high frequency radiation problem of the prior art by randomly varying the frequency of the clock circuit output within a frequency constraint bound centered at the, average clock frequency. The spectral components of the clock signal are thus spread in frequency. This spreading causes the energy of each spectral component to be distributed over a wide band, consequently lowering the power in any 1 Hz slice of the frequency spectrum. Since the spread bandwidth of each spectral component increases linearly with the harmonic number (multiple of clock rate), the higher frequency emissions, such as those that interfere with radio navigation, are significantly suppressed.

The present invention will be best understood by first examining the constraints of a typical electronic device in which the spread-spectrum dock will be employed, then by describing the preferred embodiment itself. One of the most demanding applications of the spread-spectrum clock circuit is in microprocessor-based electronic equipment. Here the maximum clock frequency is limited by the maximum speed of the microprocessor and associated digital logic, and by the use of fixed time delays associated with dynamic memory control circuits. The minimum clock frequency is primarily limited by the storage time of dynamic storage cells usually found in the microprocessor device and in memory chips. This sets the allowable frequency range for the spread-spectrum clock.

A clock frequency variation of 2 to 5% of the average clock frequency value should be sufficient for the mitigation of high frequency spectral emissions. A 5% variation from the average clock frequency results in a spread bandwidth of 10% of the clock frequency at the fundamental clock frequency and increases linearly with harmonic number, thus a spectral component at nine times the fundamental clock frequency will be spread over a bandwidth equal to 90% of the clock frequency. In some cases where the microprocessor or other circuitry cannot operate properly at a 2 to 5% higher clock rate, the center frequency of the spread-spectrum clock may be reduced by the appropriate amount.

Figure 1:
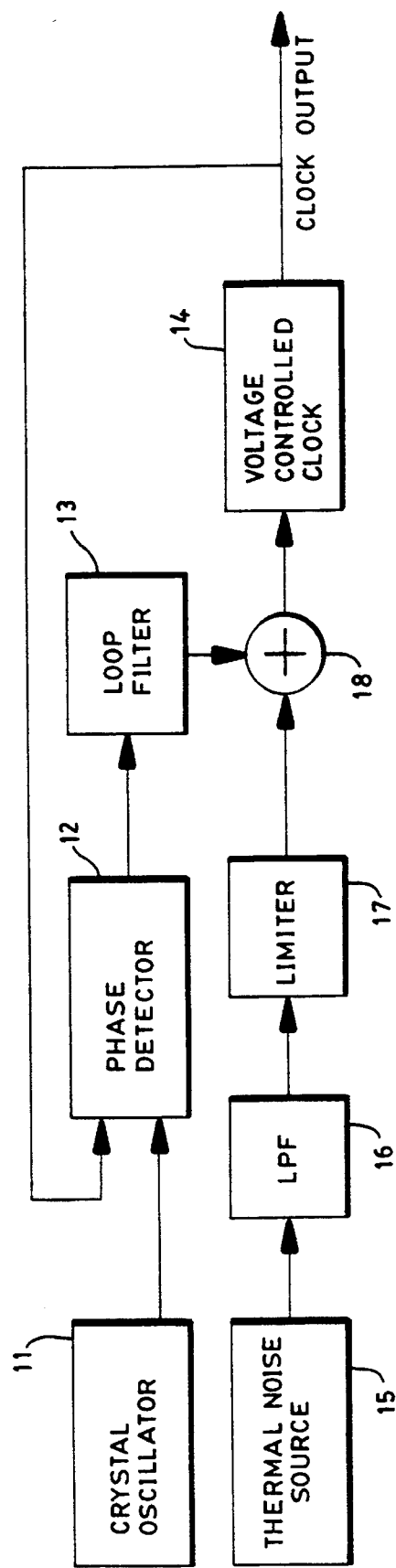
FIG. 1 is the functional block diagram of the preferred embodiment of the spread-spectrum clock of the present invention.
Figure 2:
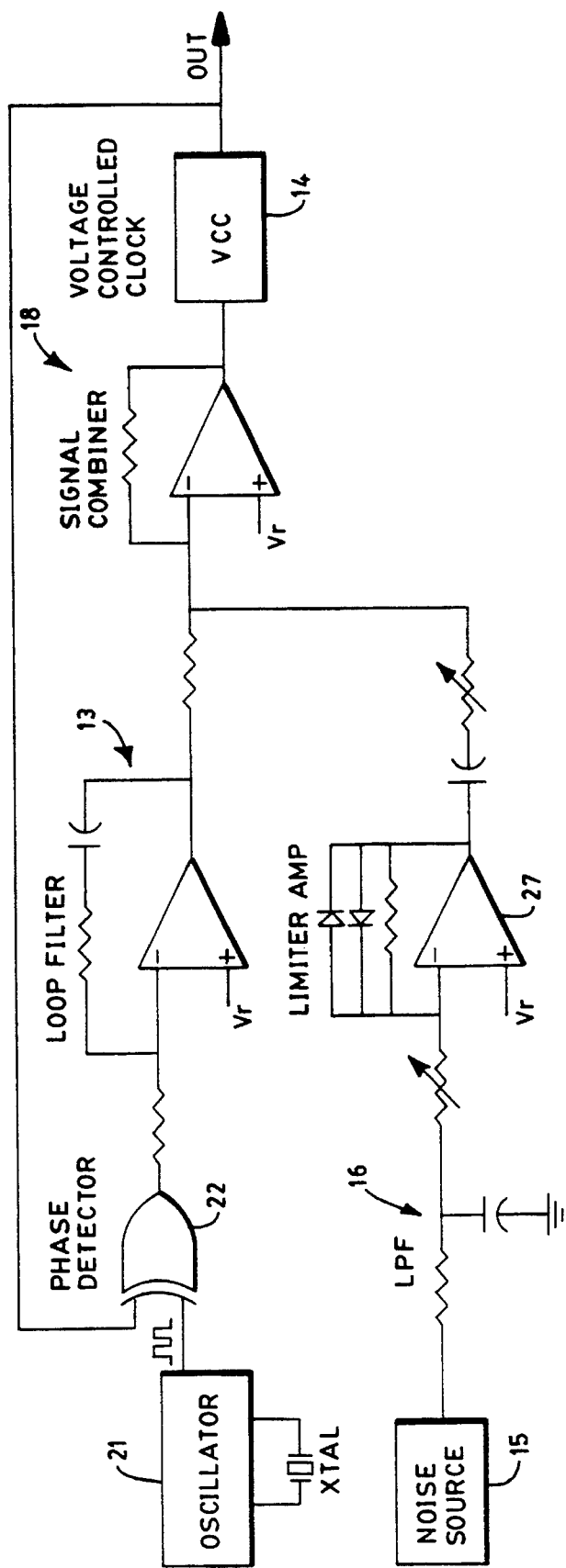
FIG. 2 is a possible implementation of the spread-spectrum clock of FIG. 1.

A functional block diagram of the preferred embodiment of the spread-spectrum clock is shown in FIG. 1. FIG. 2 illustrates a possible implementation of the preferred embodiment. Referring to the circuit of FIG. 1, the spread-spectrum clock is comprised of a crystal oscillator 11; a phase locked loop (PLL) consisting of a phase detector 12, a loop filter 13, and the voltage controlled clock (VCC) 14; a thermal (random) noise source 15; a low pass filter (LPF) 16; a limiter 17; and a signal combiner 18. The crystal oscillator 11 is identical in function to the conventional clock circuit which this invention replaces. It provides the frequency reference for the phase locked loop (PLL), blocks 12–14, and sets the exact center frequency for the spread-spectrum clock. The phase locked loop, blocks 12–14, performs two main functions for the clock circuit: first, it maintains the average output frequency at precisely that of the oscillator 11; secondly, it provides a convenient mechanism for the voltage to frequency conversion function required for frequency modulation of the voltage controlled dock VCC 14 by the random noise source, blocks 15–17.

Figure 6A:
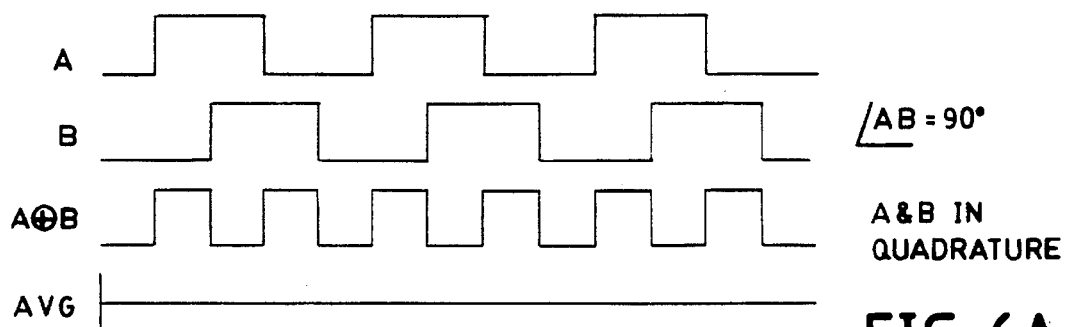
FIG. 6 illustrates the operation of an exclusive OR logic device as a phase detector.
Figure 6B:
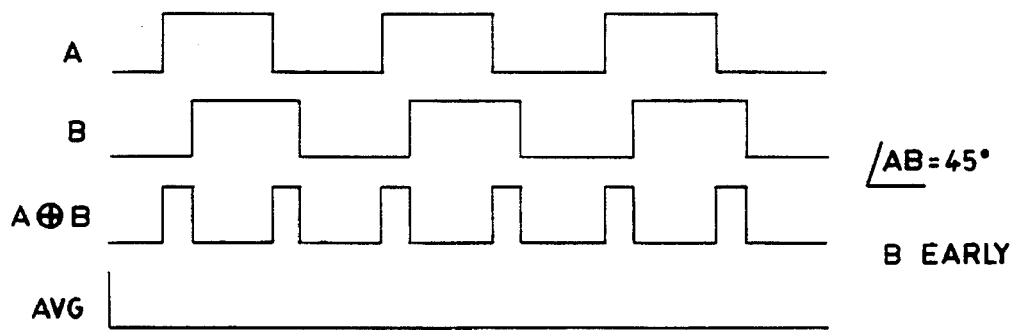
Figure 6C:
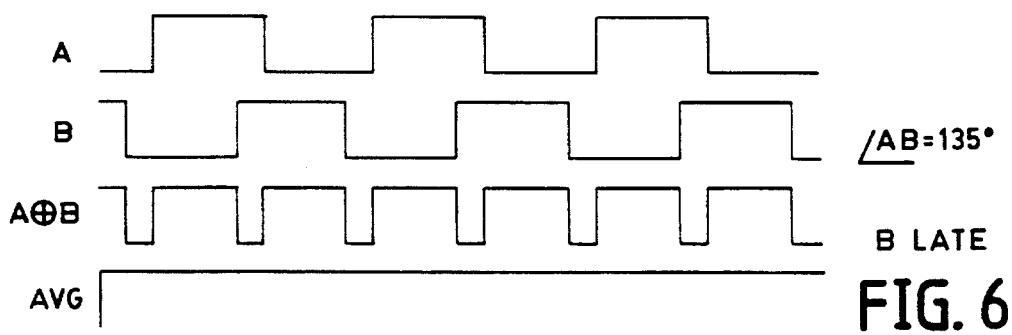

The phase detector 12 generates a phase error voltage proportional to the phase difference between the voltage controlled dock VCC 14 output and that of the oscillator 11. The implementation of FIG. 2 uses an exclusive OR logic (XOR) device 22 to generate the phase error voltage. FIG. 6 illustrates the operation of an XOR logic device as a phase detector. The top waveform set shows the phase detector with the phase locked loop in lock. The two input signals, A and B, arrive in quadrature and, thus, are in the same logic sense half of the time and are in the opposite logic sense half of the time. The XOR output is high half of the time and low the other half, which yields an average voltage level equal to the midpoint between the two logic levels. This is equal to the reference level Vr in FIG. 2. The center waveform illustrates what happens when signal B is early in phase. Here the average XOR output is below Vr. If signal B is the output of the voltage controlled dock VCC 14, this causes the VCC 14 to reduce in frequency. Likewise, if signal B lags in phase relative to signal A, the output of VCC 14 will advance in frequency.

The loop filter 13 sets the natural frequency of the phase locked loop and its robustness. The natural frequency should be well below the cutoff frequency of the low pass filter LPF 16. The signal combiner 18 combines the phase error output from the loop filter 13 with the random noise modulation from the noise source, blocks 15–17. Thus, the frequency of the random noise source 15 modulates the phase locked loop output.

The random noise source, blocks 15–17, outputs a continuously varying random voltage which is equally distributed above and below its center value (Vr in FIG. 2). The thermal noise source 15 can be any device which produces an additive white gaussian noise (AWGN) signal whose average output power is relatively constant over temperature and power supply variations. A noise diode can be used for this purpose. The low pass filter LPF 16 sets the rate of variation of the spread-spectrum dock output frequency and should not exceed the spreading bandwidth. It may be a passive filter, as shown in FIG. 2, or an active one, which may be easier to integrate.

The non-linear limiter 17 is used to assure that the final output frequency of the spread-spectrum clock does not exceed the design limits. Gain may be added to any of the noise source stages to bring the thermal noise output to the correct level.

Figure 4:
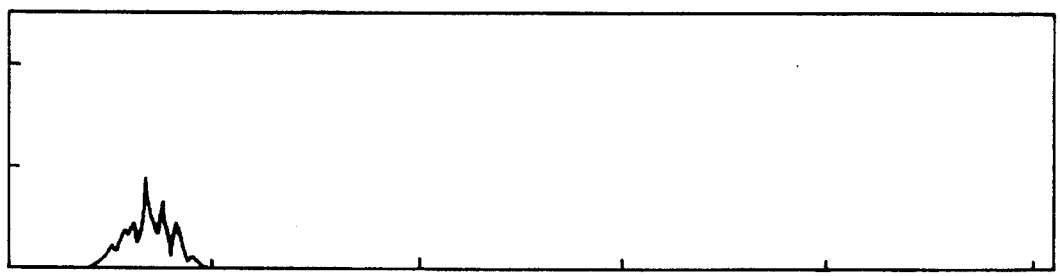
FIG. 4 is the signal of FIG. 3 which has been spread by the spread-spectrum clock of the present invention.
Figure 5:
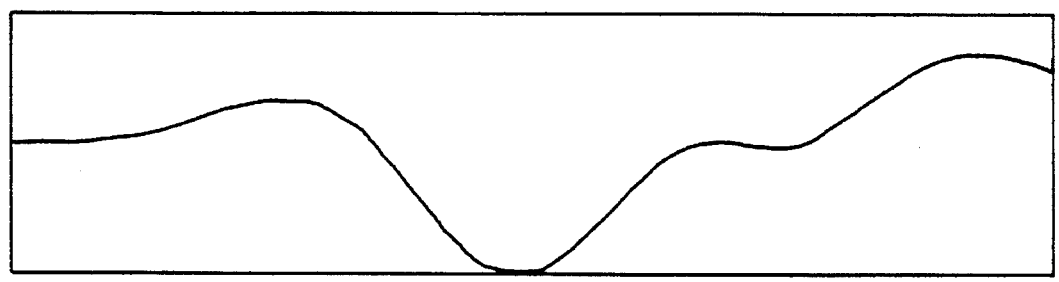
FIG. 5 is a graph of the instantaneous frequency of the spread-spectrum clock signal over time, according to the present invention.

In FIG. 4, we see that the energy has been distributed over a wide band, reducing the total power per Hz. FIG. 5 is a graph of the instantaneous frequency of the spread-spectrum clock signal over time. A phase locked loop maintains the precise average frequency, while limiters are utilized to prevent the signal from exceeding a predetermined frequency offset (the top and bottom border in FIG. 5).

The present invention solves the high frequency radiation problem of the prior art by randomly varying the frequency of the clock circuit output within a frequency constraint bound centered at the average clock frequency. The spectral components of the clock signal are thus spread in frequency. This spreading causes the energy of each spectral component to be distributed over a wide band, consequently lowering the power in any 1 Hz slice of the frequency spectrum. Since the spread bandwidth of each spectral component increases linearly with the harmonic number (multiple of clock rate), the higher frequency emissions, such as those that interfere with radio navigation, are significantly suppressed.

What is claimed is:

1. A variable frequency clock generation circuit for the reduction of spectral components above the fundamental frequency, comprising in combination:

local oscillator means for providing a local oscillator signal;

frequency generation and tracking means for providing a clock output whose average frequency is matched to said local oscillator means;

random noise generation means for providing a random modulating function for said variable frequency clock;

non-linear limiter means for restricting the minimum and maximum magnitude of said random noise generation means;

said frequency generation and tracking means providing voltage to frequency conversion of said random noise generation means; and signal combining means for the combining of said random noise generation means into said frequency generation and tracking means.

2. The variable frequency clock generation circuit of claim 1, wherein said frequency generation, means is frequency locked to the said local oscillator means.

3. The variable frequency clock generation circuit of claim 1, wherein said frequency generation means is phase locked to the said local oscillator means.

4. The variable frequency clock generation circuit of claim 1, further including filter means for the purpose of reducing the rate of change of the random noise generation means.

* * * * *